United States Patent
Di

(10) Patent No.: US 9,711,664 B2
(45) Date of Patent: Jul. 18, 2017

(54) FLEXIBLE TRANSPARENT SOLAR CELL AND PRODUCTION PROCESS OF THE SAME

(71) Applicant: BOE TECHNOLOGY GROUP CO., LTD., Beijing (CN)

(72) Inventor: Yunping Di, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 229 days.

(21) Appl. No.: 14/316,000

(22) Filed: Jun. 26, 2014

(65) Prior Publication Data

US 2015/0280026 A1    Oct. 1, 2015

(30) Foreign Application Priority Data

Mar. 28, 2014 (CN) .......................... 2014 1 0122922

(51) Int. Cl.
 *H01L 31/0224* (2006.01)
 *H01L 51/44* (2006.01)
 *H01L 31/0392* (2006.01)

(52) U.S. Cl.
 CPC ........ *H01L 31/022491* (2013.01); *H01L 31/022425* (2013.01); *H01L 31/022466* (2013.01);
 (Continued)

(58) Field of Classification Search
 CPC ........... H01L 31/022491; H01L 51/445; H01L 31/022425; H01L 31/03926; H01L 31/022466; Y02E 10/549
 See application file for complete search history.

(56) References Cited

U.S. PATENT DOCUMENTS

| 2011/0094573 A1* | 4/2011 | Wu | ................ H01L 31/02246 |
| | | | 136/255 |
| 2011/0143101 A1* | 6/2011 | Sandhu | ................ B82Y 30/00 |
| | | | 428/195.1 |

(Continued)

FOREIGN PATENT DOCUMENTS

| CN | 103236320 A | 8/2013 |
| CN | 103426941 A | 12/2013 |

(Continued)

OTHER PUBLICATIONS

First Office Action for corresponding CN Application No. 201410122922.X, dated Oct. 19, 2015, 7 pages.

(Continued)

*Primary Examiner* — Cuong B Nguyen
*Assistant Examiner* — Juanita Rhodes
(74) *Attorney, Agent, or Firm* — Kinney & Lange, P.A.

(57) ABSTRACT

The invention provides a flexible transparent solar cell and a production process of the same, and belongs to the technical field of solar cell. The flexible transparent solar cell comprises: a flexible transparent substrate, a transparent front-electrode, a cell unit, a transparent back-electrode and a transparent encapsulating layer, which are disposed in this order; the transparent front-electrode comprising a metallic grid thin film layer and a graphene layer; and the transparent back-electrode comprising a nano metal layer and a graphene layer. The invention can be used in production of flexible transparent solar cell, in order to improve conductivity and transparency of solar cells.

2 Claims, 1 Drawing Sheet

(52) U.S. Cl.
 CPC ...... *H01L 31/03926* (2013.01); *H01L 51/445* (2013.01); *Y02E 10/549* (2013.01)

(56) References Cited

U.S. PATENT DOCUMENTS

| | | | |
|---|---|---|---|
| 2013/0032913 A1* | 2/2013 | Kimura | H01B 1/04 257/431 |
| 2013/0048339 A1* | 2/2013 | Tour | H01B 1/04 174/126.1 |
| 2013/0187097 A1* | 7/2013 | Hong | C23C 16/26 252/510 |
| 2013/0306361 A1* | 11/2013 | Kim | H05K 1/097 174/257 |
| 2014/0159181 A1* | 6/2014 | Kim | B01J 35/004 257/431 |
| 2014/0183736 A1* | 7/2014 | Cox | H01L 51/442 257/741 |
| 2016/0020416 A1* | 1/2016 | Guimard | H01L 51/5212 257/40 |
| 2016/0027935 A1* | 1/2016 | Naito | H01L 31/1884 438/98 |

FOREIGN PATENT DOCUMENTS

| | | |
|---|---|---|
| CN | 103474485 A | 12/2013 |
| KR | 20110044442 A | 4/2011 |

OTHER PUBLICATIONS

Second Office Action (including English translation) for corresponding CN Application No. 201410122922.X, dated Apr. 8, 2016.

\* cited by examiner

FLEXIBLE TRANSPARENT SOLAR CELL AND PRODUCTION PROCESS OF THE SAME

CROSS-REFERENCE TO RELATED APPLICATION

This application claims the benefit of Chinese Patent Application No. 201410122922. X filed on Mar. 28, 2014 in the State Intellectual Property Office of China, the whole disclosure of which is incorporated herein by reference.

FIELD OF THE INVENTION

The invention relates to the technical field of solar cell, in particular, to a flexible transparent solar cell and a production process of the same.

BACKGROUND OF THE INVENTION

Flexible solar cell is a kind of thin film solar cell. It is superior in property, low in cost, and wide in application. In addition to be applied in building integrated photovoltaic applications, it is also applicable for producing a portable solar charger, which is used in outdoor as a charging equipment for mobile phones, laptops and the like. Since this kind of cell further has the nature of flexibility, it has prospect of being used in flexile OLED displays and LCD displays rapidly.

In flexible solar cells of prior art, the configuration thereof is that a flexible substrate, a transparent front-electrode, a cell unit and a transparent back-electrode are arranged from the bottom to the top. Here, ITO (tin-doped indium oxide), AZO (aluminium-doped zinc oxide) or FTO (fluorine-doped tin oxide) is a transparent electrode, and serves as the transparent front-electrode or transparent back-electrode mentioned above. Since these transparent electrodes are produced into films by vacuum sputtering, the production cost of the same is high. In particular, the brittleness and mechanical flexibility of these transparent electrode thin films are inferior, so that the flexible thin film solar cells are degraded in property and limited in lifetime. Additionally, the conductivity demand of the transparent electrode makes the adjustable range of the transparency thereof smaller, which further restricts the application thereof in the field such as flexible transparent solar cell. Therefore, the search for a new flexible transparent thin film solar cell and a production process of the same will be an important topic, with which those skilled in the art are faced.

SUMMARY OF THE INVENTION

An object of the invention is to provide a flexible transparent solar cell and a production process of the same, in order to improve conductivity and transparency of the solar cells.

In order to achieve the above-mentioned object, the invention adopts following technical solutions.

In one aspect, the invention provides a flexible transparent solar cell, comprising: a flexible transparent substrate, a transparent front-electrode, a cell unit, a transparent back-electrode and a transparent encapsulating layer, which are disposed in this order;

the transparent front-electrode comprising a metallic grid thin film layer and a graphene layer; and the transparent back-electrode comprising a nano metal layer and a graphene layer.

In one preferable embodiment, the transparent front-electrode comprises:

a first graphene layer being in contact with the flexible transparent substrate;

a metallic grid thin film layer located on the surface of the first graphene layer; and a second graphene layer located on the surface of the metallic grid thin film layer.

In one more preferable embodiment, the metallic grids in the metallic grid thin film layer include metallic copper grids and metallic silver grids.

In one preferable embodiment, the transparent back-electrode comprises:

a third graphene layer being in contact with the cell unit; and a nano metal layer located on the surface of the third graphene layer.

In one more preferable embodiment, the material of the nano metal layer is selected from the group consisting of metallic nanowires and metallic particles.

In one preferable embodiment, the cell unit is selected from the group consisting of a silicon-based thin film cell unit and an organic thin film cell unit.

In another aspect, the invention provides a production process of the flexible transparent solar cell described in any one of the above-mentioned technical solutions, comprising:

providing a flexible transparent substrate;

forming a transparent front-electrode comprising a metallic grid thin film layer and a graphene layer on the flexible transparent substrate;

forming a cell unit on the transparent front-electrode;

forming a transparent back-electrode comprising a nano metal layer and a graphene layer on the cell unit; and forming a transparent encapsulating layer on the transparent back-electrode.

In one preferable embodiment, said forming a transparent front-electrode comprising a metallic grid thin film layer and a graphene layer on the flexible transparent substrate comprises:

forming a first graphene layer, and transferring the first graphene layer onto the flexible transparent substrate;

forming a metallic grid thin film layer on the first graphene layer; and forming a second graphene layer, and transferring the second graphene layer onto the metallic grid thin film layer, so as to obtain the transparent front-electrode.

In one more preferable embodiment, said forming a first graphene layer, and transferring the first graphene layer on to the flexible transparent substrate comprises:

firstly depositing the first graphene layer on a catalytic metallic substrate, then transferring the first graphene layer onto the flexible transparent substrate.

In one preferable embodiment, said forming a transparent back-electrode comprising a nano metal layer and a graphene layer on the cell unit comprises:

forming a third graphene layer, and transferring the third graphene layer onto the cell unit;

then forming a nano metal layer on the third graphene layer, so as to obtain the transparent back-electrode.

The invention provides a flexible transparent solar cell and a production process of the same. As compared with flexible solar cells in prior art, the difference is that the transparent front-electrode and the transparent back-electrode of the flexible transparent solar cell provided by the invention consist of a metallic grid thin film layer and a graphene layer and of a nano metal layer and a graphene layer, respectively. In the above-mentioned composite film layer consisting of plural layers, a metallic grid thin film layer/nano metal layer is capable of achieving the contact with the graphene with low resistance, which can effectively decrease the square resistance of the composite film layer electrode. Furthermore, the use of graphene in combination with a metallic grid thin film layer/nano metal layer also can utilize their advantages while suppressing their disadvantages, so as to obtain excellent flexibility, light transmission and stability. Thereby, the conductivity and light transmission of the solar cell are improved.

DETAILED DESCRIPTION OF THE INVENTION

The technical solutions in the examples of the invention will be described clearly, completely and more in detail below in combination with the drawings in the examples of the invention. Obviously, the examples described are only illustration for describing the invention, but not restrictions on the invention. Based on the examples of the invention, all of other examples, which are obtained by those skilled in the art without paying inventive labor, fall within the protection scope of the invention.

The flexible transparent solar cell and the production process of the same provided by the examples of the invention will be described in detail below in combination with the drawings.

Figure 1:
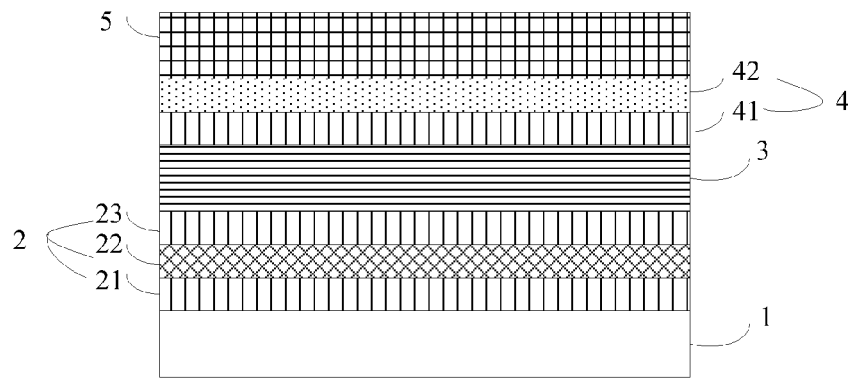
FIG. 1 is a schematic of a flexible transparent solar cell provided by one example of the invention.

FIG. 1 is a schematic of a flexible transparent solar cell provided by one example of the invention. As shown in FIG. 1, in one aspect, the invention provides a flexible transparent solar cell, comprising: a flexible transparent substrate 1, a transparent front-electrode 2, a cell unit 3, a transparent back-electrode 4 and a transparent encapsulating layer 5, which are disposed in this order;

the transparent front-electrode 2 comprising a metallic grid thin film layer 22 and a graphene layer; and the transparent back-electrode 4 comprising a nano metal layer 42 and a graphene layer.

Graphene is a planar thin film consisting of carbon atoms, which build hexagonal honeycomb-like crystal lattices via $sp^2$ hybrid orbitals. The thickness of graphene is only 0.335 nm The light transmittance of a monolayer graphene film layer is up to 97.7%. The light transmittance of a three graphene film layers is still 90% or above. Graphene has carrier mobility of up to $2\times10^5$ $cm^2$/Vsec, and has excellent conductivity and light transmission; and has a tensile strength of up to 130 GPa, and has excellent mechanical strength and very good flexibility. Additionally, since the valence electronic structure causing the close packing of carbon atoms, the structure of graphene is very stable, and has high chemical stability and environmental stability.

In one example of the invention, the transparent front-electrode 2 comprises a metallic grid thin film layer 22 and a graphene layer, and the transparent back-electrode 4 comprises a nano metal layer 42 and a graphene layer, wherein the manner of using the graphene layer in combination with the metallic grid/nano metal layer is adopted. It is needed to be explained that in view of such a combination, the graphene layer and the metallic grid/nano metal layer are only individually combined, however, from the viewpoint of the function of the composite film layer as a whole, it is not a simple addition between the both. The reason thereof is that graphene, when being in combination with the metallic grid thin film layer/nano metal layer, exhibits unique optical and electrical properties, which has the high light transmission of graphene, as well as can have the resonance-enhancing characteristic of the surface plasma of metallic grid/nano metal, so as to increase the utilization ratio of the transmitted light. When the both are combined, according to the low-resistance effect of the metallic grid/nano metal, they can not only achieve the contact with the graphene layer with low resistance, but also effectively reduce the square resistance of the composite film layer.

One example of the invention provides a flexible transparent solar cell and a production process of the same. As compared with flexible solar cells in prior art, the difference is that the transparent front-electrode and the transparent back-electrode of the flexible transparent solar cell provided by the example of the invention consist of a metallic grid thin film layer and a graphene layer and of a nano metal layer and a graphene layer, respectively. In the above-mentioned composite film layer consisting of plural layers, the metallic grid thin film layer/nano metal layer is capable of achieving the contact with the graphene with low resistance, which can effectively decrease the square resistance of the composite film layer electrode. Furthermore, the use of graphene in combination with a metallic grid thin film layer/nano metal layer also can utilize their advantages while suppressing their disadvantages, so as to obtain excellent flexibility, light transmission and stability, thereby improves the conductivity and light transmission of the solar cell.

In one example of the invention, the transparent front-electrode 2 is a composite film layer. In one preferable embodiment, the transparent front-electrode 2 comprises: a first graphene layer 21; a metallic grid thin film layer 22 located on the surface of the first graphene layer 21; and a second graphene layer 23 located on the surface of the metallic grid thin film layer 22. The graphene itself has good mechanical flexibility, high light transmittance, excellent conductivity, chemical stability, so that the front transparent electrode formed by using a triple laminated structure of graphene/metallic grid/graphene also possesses the above-mentioned advantages. Additionally, since the square resistance of the metallic grid can be as low as 1Ω/sq. or less, the square resistance of the transparent electrode in the front transparent electrode, that is, graphene first composite film layer, which is formed of the triple laminated structure of graphene/metallic grid/graphene, can be remarkably reduced. In one preferable embodiment, the example of the metallic grids in the metallic grid thin film layer can include metallic copper grids and metallic silver grids.

It is needed to be explained that since for graphene, the transmittance of the monolayer thin film is up to 97.7% and the transmittance of the three thin film layer is also above 90%, the number of the graphene layers contained in the transparent front-electrode is adjustable. It can consist of a first graphene layer and a metallic grid thin film layer only; or can consist of a first graphene layer 21, a metallic grid thin film layer 22 and a second graphene layer 23; or can be provided with three or more graphene layers, with metallic grid thin film layers intercalated between two of them. The above-mentioned forms of combination would not affect the mechanical flexibility, high light transmittance and conductivity of the one serving as the front-electrode. In one example of the invention, the front transparent electrode, which is formed by intercalating a metallic grid thin film layer between two graphene layers, is preferred. The reason thereof is that graphene can also serve as an excellent barrier layer at the same time, can not only prevent the metallic elements from diffusing into the cell unit, but also prevent the water vapor or element such as oxygen from corroding the metallic grid, so as to allow the front transparent electrode formed of the triple laminated structure of graphene/metallic grid/graphene having excellent chemical stability and environmental stability.

In one example of the invention, the transparent back-electrode 4 is a composite film layer. In one preferable embodiment, it comprises: a third graphene layer 41; and a nano metal layer 42 located on the surface of the third graphene layer 41. In one example of the invention, since the graphene itself has good mechanical flexibility, high light transmittance, excellent conductivity and chemical stability, the back transparent electrode formed of that laminated structure possesses the above-mentioned advantages, while being able to conduct electrons out very well. Additionally, the nano metal thin film layer can generate nano light trapping effect, which can reflect a part of light back to the solar cell for reuse while reducing the reflection effect of the external environmental light. In one preferable embodiment, the material of the nano metal layer is selected from the group consisting of metallic nanowires and metallic nanoparticles. Among these, the nano silver wires can be selected as the metallic nanowires; the metallic nanoparticles can be selected from nano silver particles, nano gold particles or nano copper particles.

It is needed to be explained that the density of the nano metal thin film layer is adjustable. By adjusting the density of the nano metal thin film layer, the light transmission of the solar cell can be adjusted. Thereby, it is possible to make the transparency the nano metal thin film layer become the corresponding transparency for producing the desired solar cell. The main reason of adopting the laminated structure of graphene/nano metal thin film and disposing the nano metal thin film over the graphene layer is that the graphene layer can also serve as an excellent barrier layer and thus prevent the metallic elements from diffusing into the absorption layer of the cell.

In another example of the invention, in one preferable embodiment, the cell unit 3 can be selected from the group consisting of a silicon-based thin film cell unit and an organic thin film cell unit. Among these, the silicon-based thin film cell unit can be selected from: silicon-based thin film cell units having p-i-n single junction laminated structure, double laminated structure or triple laminated structure consisting of p-type amorphous silicon (or nanocrystalline silicon or microcrystalline silicon) thin film doped with B, intrinsic amorphous silicon (or nanocrystalline silicon or microcrystalline silicon) thin film and n-type amorphous silicon (or nanocrystalline silicon or microcrystalline silicon) thin film doped with P. The organic thin film cell unit can be selected from organic thin film solar cell units having monolayer structure, double layer p-n heterojunction structure or bulk heterojunction structure consisting of organic semiconductor materials. It can be understood that the cell units listed in the examples of the invention is only used for illustrative understanding, but not regarded as restriction on the selection scope of the cell unit.

Figure 2:
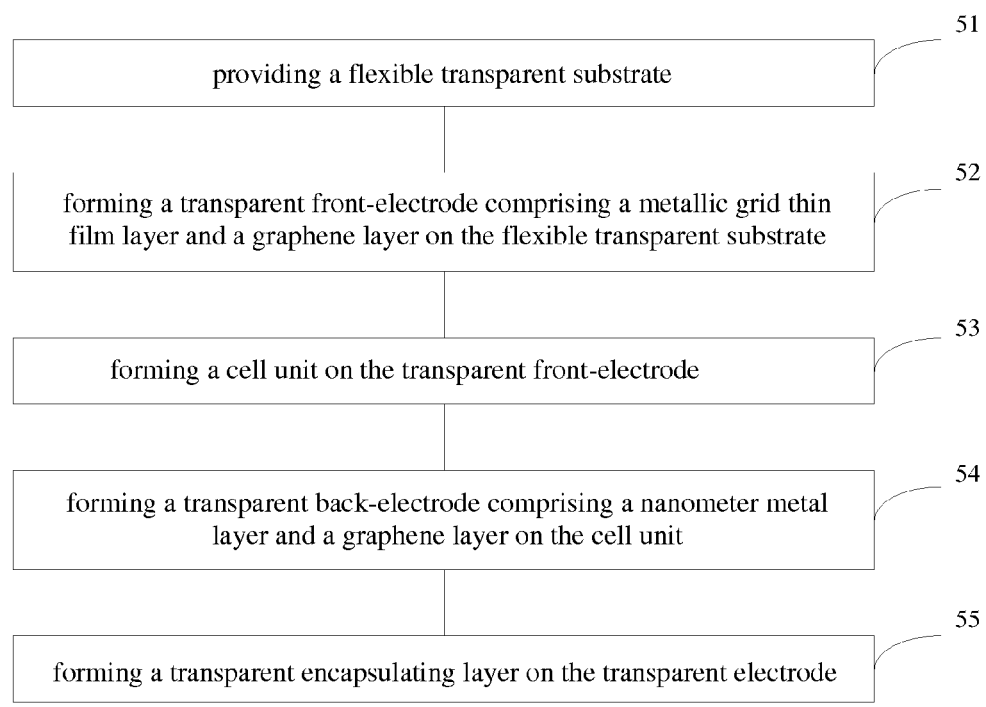
FIG. 2 is a processing flow chart of the production process of a flexible transparent solar cell provided by an example of the invention.

FIG. 2 is a processing flow chart of the production process of a flexible transparent solar cell provided by an example of the invention. As shown in FIG. 2, in another aspect, the invention provides a production process of the flexible transparent solar cell described in any one of the above-mentioned examples. The process comprises the following steps 51, 52, 53, 54 and 55:

51: providing a flexible transparent substrate.

In this step, the flexible transparent substrate provided needs to be pre-treated. If the substrate is protected by a protecting film thereon, the protecting film should be removed. The flexible transparent substrate provided can be selected from materials such as high temperature plastics, resins, aluminium foil and steel strip. It could be understood that those skilled in the art can select other materials, which is applicable as flexible transparent substrate, according to the practical demands.

52: forming a transparent front-electrode comprising a metallic grid thin film layer and a graphene layer on the flexible transparent substrate.

In this step, it can comprise: forming a first graphene layer, and transferring the first graphene layer onto the flexible transparent substrate; forming a metallic grid thin film layer on the first graphene layer; and forming a second graphene layer, and transferring the second graphene layer onto the metallic grid thin film layer, so as to obtain the transparent front-electrode.

Further, the above-mentioned step can specifically comprise: firstly depositing the first graphene layer on a catalytic metallic substrate, then transferring the first graphene layer onto the flexible transparent substrate. Here, said firstly depositing the first graphene layer on a catalytic metallic substrate can comprise: growing a graphene layer on a catalytic metallic substrate by using chemical vapor deposition techniques, then transferring the first graphene layer onto the flexible transparent substrate by a method of dry transfer or wet transfer. Thereafter, screen printing method can be used in the production of the metallic grid thin film layer, so as to cover it onto the surface of the first graphene layer; and at last, the second graphene layer is transferred onto the metallic grid thin film layer, wherein the specific process is the same as that for forming the first graphene layer on the flexible transparent substrate and not described again here.

It is needed to be explained that in this step, when forming the transparent front-electrode comprising a metallic grid thin film layer and a graphene layer on the flexible transparent substrate, a second method can be used, that is, it is possible to grow a first graphene layer on the flexible transparent substrate directly; then to form a metallic grid thin film layer on the first graphene layer; and at last, to grow a second graphene layer on the metallic grid thin film layer directly, so as to obtain the transparent front-electrode. It should be understood that those skilled in the art can select the manner specifically adopted to produce the transparent front-electrode, according to the practical demands.

53: forming a cell unit on the transparent front-electrode.

In this step, it is possible to form a silicon-based thin film having a p-i-n single junction laminated structure, a double laminated structure or a triple laminated structure as the cell unit, by depositing a p-type silicon-based thin film doped with B on the surface of the transparent front-electrode, then to deposit an i-type silicon-based thin film on the p-type silicon-based thin film, then to deposit a n-type silicon-based thin film doped with P on the i-type silicon-based thin film. Additionally, those skilled in the art can also separately deposit inorganic thin film cell units, such as doped silicon, gallium arsenide, gallium nitride or zinc oxide or the like; separately deposit organic thin film cell units, such as organic thin film solar cell units having monolayer structure, double layer p-n heterojunction structure or bulk heterojunction structure consisting of conductive polymer materials, such as poly(p-phenylenevinylene), polyaniline, polythiophene, pentacene, fullerene and derivates thereof.

54: forming a transparent back-electrode comprising a nano metal layer and a graphene layer on the cell unit.

In this step, it can comprise: forming a third graphene layer, and transferring the third graphene layer onto the cell unit; then forming a nano metal layer on the third graphene layer, so as to obtain the transparent back-electrode.

Further, the above-mentioned step can specifically comprise: firstly depositing the third graphene layer on a catalytic metallic substrate, then transferring the first graphene layer onto the cell unit. The detailed process is the same as that for forming the first graphene layer on the flexible transparent substrate and not described again here. Thereafter, a nano metal layer (metallic nanowires or metallic nanoparticles) can be produced on the third graphene layer by a processing method, such as solution coating method, jet-ink printing method, screen printing method, vacuum evaporating method, or the like, and the light transmission of the solar cell can be adjusted directly by adjusting the density of the nano metal thin film.

55: forming a transparent encapsulating layer on the transparent back-electrode.

In this step, after the above-mentioned steps are finished, in the end, the step is finished by forming a transparent encapsulating layer on the graphene second composite film layer.

The invention provides a production process of a flexible transparent solar cell. The flexible transparent solar cell produced by this process allows that the metallic grid thin film layer/nano metal layer is capable of achieving the contact with graphene with a low resistance by using a metallic grid thin film layer/nano metal layer in combination with graphene, so that the square resistance of the electrode in the composite film layer can be decreased effectively. Additionally, since graphene and the metallic grid thin film layer/nano metal layer exhibit their advantages while eliminating their disadvantages in property, the flexible transparent solar cell produced by this process further obtains excellent flexibility, light transmission and stability. Thereby, the conductivity and light transmission of the solar cell are improved. This process is easy in operation, strong in applicability, and widely applicable in flexible transparent solar cells and other flexible photovoltaic devices.

Obviously, the above-mentioned examples are only illustrations for clear explanation, and not restriction on embodiments. For those skilled in the art, it is possible to make change or modification in other different forms on the basis of the description above. Herein, it is not needed, and not possible, to list each and every embodiment. And the apparent changes or modifications derived therefrom still fall within the protection scope of the invention.

What is claimed is:

1. A production process of forming a flexible transparent solar cell that includes a flexible transparent substrate, a transparent front-electrode, a cell unit, a transparent back-electrode and a transparent encapsulating layer, which are disposed in this order; wherein the transparent front-electrode comprises: a first graphene layer in contact with the flexible transparent substrate; a metallic grid thin film layer located on a surface of the first graphene layer; and a second graphene layer located on a surface of the metallic grid thin film layer; and the transparent back-electrode comprises: a third graphene layer in contact with the cell unit; and a nano metal layer located on a surface of the third graphene layer; the production process comprising:
providing the flexible transparent substrate;
forming the transparent front-electrode on the flexible transparent substrate by a process comprising:
growing the first graphene layer on a first catalytic metallic substrate by using chemical vapor deposition techniques, then transferring the first graphene layer onto the flexible transparent substrate by a method of dry transfer or wet transfer, so that the first graphene layer is directly on a whole surface of the flexible transparent substrate;
producing the metallic grid thin film layer by using a screen printing method, and covering a surface of the first graphene layer with the metallic grid thin film layer; and then
growing the second graphene layer on a second catalytic metallic substrate by using chemical vapor deposition techniques, then transferring the second graphene layer onto the metallic grid thin film layer by a method of dry transfer to wet transfer;
forming the cell unit on the transparent front-electrode;
forming the transparent back-electrode on the cell unit; and
forming the transparent encapsulating layer on the transparent back-electrode.

2. The production process according to claim 1, wherein said forming a transparent back-electrode on the cell unit comprises:
forming the third graphene layer, and transferring the third graphene layer onto the cell unit;
then forming the nano metal layer on the third graphene layer, so as to obtain the transparent back-electrode.

* * * * *